United States Patent [19]

Tsai

[11] Patent Number: 5,068,657

[45] Date of Patent: Nov. 26, 1991

[54] METHOD AND APPARATUS FOR TESTING DELTA-SIGMA MODULATORS

[75] Inventor: Sheng-Jen Tsai, Newtown, Pa.

[73] Assignee: AT&T Bell Laboratories, Murray Hill, N.J.

[21] Appl. No.: 528,514

[22] Filed: May 25, 1990

[51] Int. Cl.⁵ ............................................. H03M 1/10
[52] U.S. Cl. .................................... 341/120; 341/143
[58] Field of Search ........................ 341/118, 120, 143

[56] References Cited

U.S. PATENT DOCUMENTS

| 4,542,354 | 9/1985 | Robinton et al. | 341/143 |
| 4,943,807 | 7/1990 | Early et al. | 341/120 |
| 4,951,052 | 8/1990 | Jacob et al. | 341/122 |

OTHER PUBLICATIONS

Crystal Semiconductor Corporation Data Book, (Jul. 1989), pp. 15-67 thru 15-71.

Primary Examiner—A. D. Pellinen
Assistant Examiner—Marc S. Hoff
Attorney, Agent, or Firm—Robert B. Levy

[57] ABSTRACT

A delta-sigma modulator (14) is readily tested by sampling an input test signal at a first rate and inputting the samples to the delta-sigma modulator under test so that the modulator outputs a digital signal representative of each sample. The input signal is also sampled at a second rate and an error factor is then established in accordance with the difference between the value of the output signal produced by the delta-sigma modulator and the value of the sample obtained by sampling the input signal at the second rate. By comparing the error factor to a prescribed value, the proper operation of the delta-sigma modulator can be verified.

9 Claims, 1 Drawing Sheet

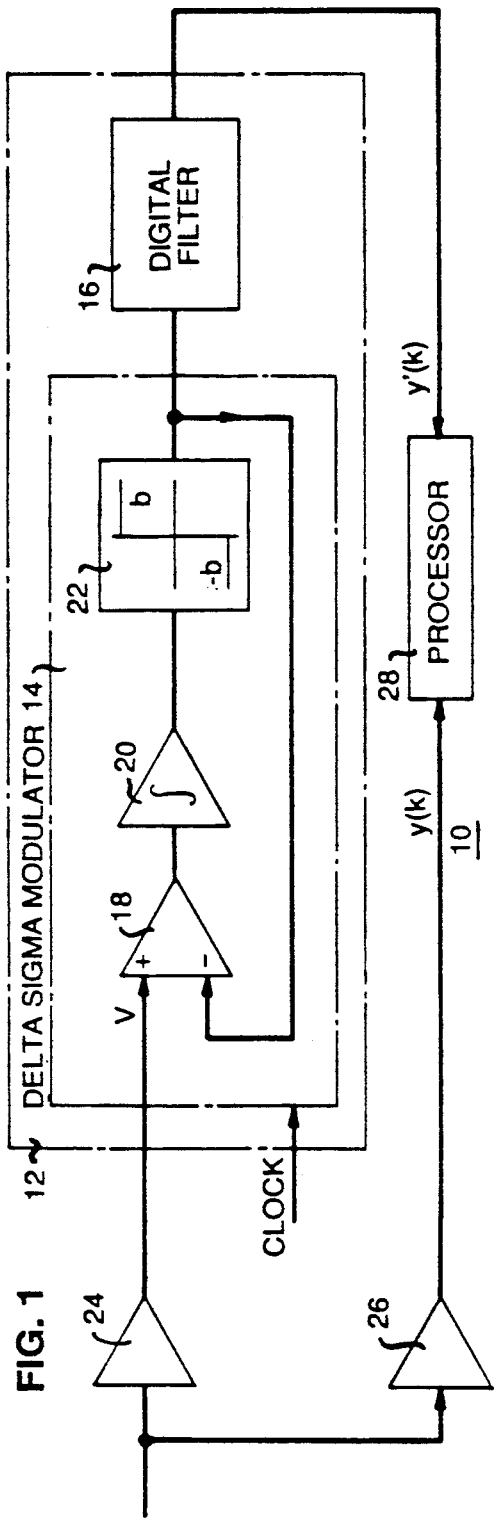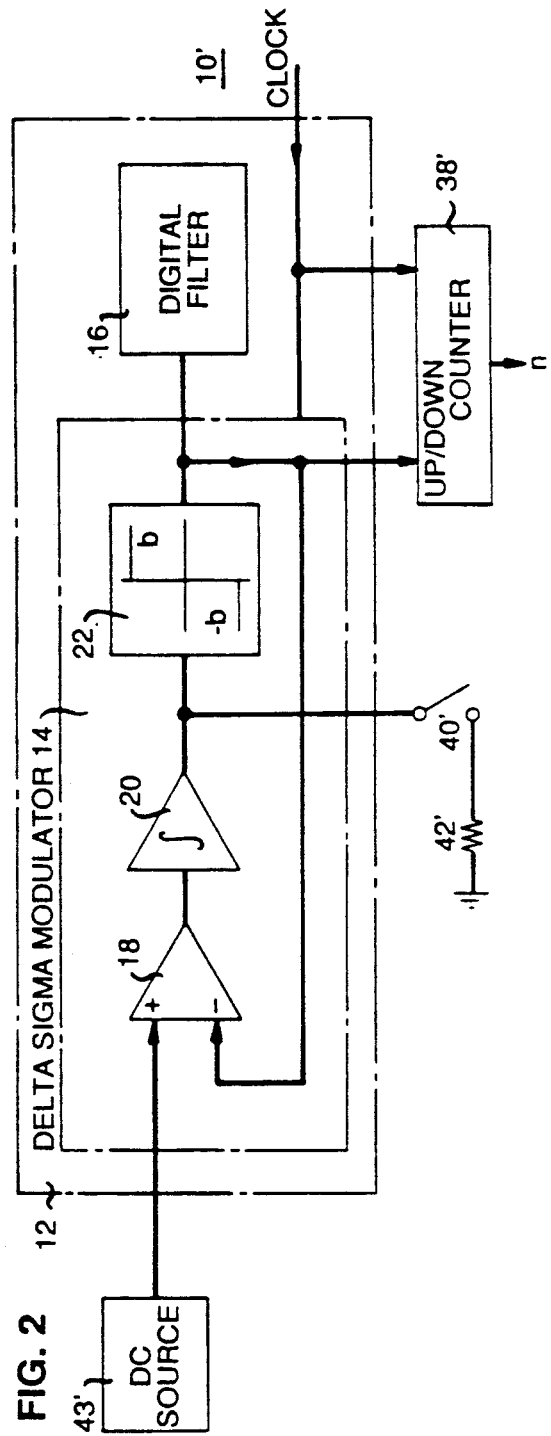

5,068,657

METHOD AND APPARATUS FOR TESTING DELTA-SIGMA MODULATORS

TECHNICAL FIELD

This invention relates to a method and associated apparatus for testing delta-sigma modulators which are a particular class of devices for performing voltage-to-frequency conversion.

BACKGROUND OF THE INVENTION

Delta-Sigma modulators are a class of voltage-to-frequency conversion devices. When coupled to a digital filter, the combination of the delta-sigma modulator and filter yields a delta-sigma modulator A/D converter with very high performance. A typical delta-sigma modulator functions as a voltage-to-frequency converter which produces an output voltage of $+b$ or $-b$ (where b is typically $+1$ volt) in accordance with the input voltage to the modulator. (When the input voltage is zero, the analog modulator output voltage is zero.) The digital signal produced by the delta-sigma modulator, when filtered by the digital filter, yields a serial signal representative of the level of the voltage input to the modulator.

In the past, delta-sigma modulators have been tested by comparing whether the frequency domain value of the Signal-to-Noise (S/N) ratio of the modulator is significantly below a prescribed value. The frequency domain value of the S/N ratio has been established from a power spectrum density of the samples output by the delta-sigma modulator when samples of a sinusoidal signal is applied to its input. The power density spectrum has been computed by performing a Fourier transform on each output sample to obtain its value in the frequency domain, and thereafter multiplying the value by its conjugate.

Testing the delta-sigma modulator in this fashion is a relatively complex undertaking. The complexity (i.e., number of operations) associated with performing a Fourier transform on n delta-sigma modulator output signals (where n is an integer) is n log(n) complex multiplications. The complexity associated with establishing a power spectrum density of the n output signals by multiplying the Fourier transform of each signal by its complex conjugate is 2n complex multiplications because the Fourier transform and complex conjugate of each signal are typically complex numbers. Lastly, the complexity associated with establishing the signal-to-noise ratio of the delta-sigma modulator from the power spectrum density of the samples output is approximately n real additions. Thus, the overall complexity associated with testing the delta-signal modulator in this manner is on the order of n log(n)+2n complex multiplications and n real additions.

Thus, there is a need for a technique for testing a delta-sigma modulator with reduced complexity.

SUMMARY OF THE INVENTION

Briefly, in accordance with a preferred embodiment of the invention, a method is disclosed for testing a delta-sigma modulator with a reduced level of complexity. The method is initiated by sampling an input test signal at a first rate and inputting the samples to a delta-sigma modulator under test so that the modulator outputs a digital signal representative of each sample. The input signal is also sampled at a second rate, typically less than the first rate. An error factor is then established in accordance with the difference between the value of the output signal produced by the delta-sigma modulator and the value of the sample obtained by sampling the input signal at the second rate. By comparing the error factor to a prescribed value, the proper operation of the delta-sigma modulator can be verified.

The above-described method may be practiced by choosing the second sampling rate (i.e., the rate at which the input signal is sampled for comparison purposes) to the Nyquist rate. Choosing the second sampling rate to be equal to the Nyquist rate requires that the first sampling rate be made larger, so that the input test signal is "over-sampled." The error factor chosen to evaluate the delta-sigma modulator is its Signal-to-Noise (S/N) ratio. The actual S/N ratio of the delta-sigma modulator is established by first computing an intermediate error value ($e^2$) in accordance with the sum of the square of the difference between each output signal of the modulator and each sample obtained by sampling the input signal at the Nyquist rate. The ratio of the delta-sigma modulator output signal magnitude ($b^2$) to the intermediate error signal ($e^2$) yields a measure of the actual S/N ratio of the delta-sigma modulator. By comparing the actual value of the S/N ratio of the delta-sigma modulator to the expected value therefor, the proper operation of the modulator can be determined.

Alternatively, the testing method may be practiced by choosing the input signal to be a dc value and choosing the second sampling rate to be unity. The error value computed is the difference between the magnitude of the dc input signal to the delta-sigma modulator and the output signal of the delta-sigma modulator, as summed by a counter. This error signal, representing the degree of error in output signal of the delta-sigma modulator, is thus indicative of the modulator's operation. This particular testing scheme may be incorporated within the delta-sigma modulator itself to provide the modulator with a built-in self-test (BIST) capability.

BRIEF DESCRIPTION OF THE DRAWING

FIG. 1 is a block schematic diagram of a first preferred embodiment of an apparatus in accordance with the present invention for testing a delta-sigma modulator; and FIG. 2 is a block schematic diagram of a second preferred embodiment of an apparatus in accordance with the present invention for testing a delta-sigma modulator.

DETAILED DESCRIPTION

FIG. 1 is a block schematic diagram of a system 10, in accordance with a first preferred embodiment of the invention, for testing a delta-sigma modulator Analog-to-Digital (A/D) converter 12 and, particularly, its delta-sigma modulator 14. To best understand the operation of the system 10, a brief description of the structure and operation of the delta-sigma modulator A/D converter 12 will prove helpful. In its simplest form, the delta-sigma modulator A/D converter 12 comprises a delta-sigma modulator 14 for coverting an input voltage to a binary (frequency) output signal and a digital filter 16 for filtering the output signal of the analog modulator.

The delta-sigma modulator 14 may be represented as a differential amplifier 18 having an invert ($-$) input, and a non-invert input ($+$), the latter being supplied with an input signal V, corresponding to the input signal to the delta-sigma modulator. The differential amplifier 18 generates a signal, in accordance with the difference between the signals at its invert and non-invert inputs, which is supplied to the input of an integrator 20. The integrator 20 operates to integrate (that is, to sum and delay) the signal at its input, yielding an output signal which is supplied to the input of a comparator 22 which produces an output signal whose level is +b or −b volts (where b is typically unity) depending on whether the signal at the comparator input is greater or less than zero.

The signal at the output of the comparator 22, which is the output signal of the analog modulator 14, is supplied to the invert input (−) of the differential amplifier 18. Thus, the output voltage of the comparator (+b or −b volts) is subtracted by the differential amplifier 18 from the input voltage applied its non-invert input (+). Depending on the magnitude of the input voltage V at its non-invert input, the differential amplifier 18 will output either a positive or negative voltage to the integrator 20 which sums the voltage input thereto with the voltage previously applied to the integrator input. The magnitude of the output voltage of the integrator 20 (which is dependent on the voltage output by the differential amplifier 18) controls whether the output signal of the comparator 22 is +b or −b volts.

The process by which the delta-sigma modulator 14 operates is a dynamic one. The delta-sigma modulator 14 is responsive to a periodic timing or clock signal supplied from an external source (not shown). In response to a clock signal, the delta-sigma modulator 14 performs the steps of: (a) subtracting the comparator 22 output signal (+b or −b) from input signal V, (b) integrating the resultant voltage following subtraction, and (c) generating a signal of +b or −b depending on whether the voltage after integration is positive or negative. The resultant output signal of the comparator 22, (either +b or −b) is supplied to the digital filter 16 which filters the signal to generate a serial stream of bits representing the level of the input signal V.

Testing of the delta-sigma modulator A/D converter 12, and, by implication, the delta-sigma modulator 14, can be carried out by establishing the error between the value of the input voltage V and the value of the digitized signal output by the filter 16. This may be accomplished by comparing the actual Signal-to-Noise (S/N) ratio of the delta-sigma modulator A/D converter 12 to a reference value representing the lowest allowable S/N ratio for the converter. In the past, the actual value of the S/N ratio of the delta-sigma modulator converter 12 was computed from a power spectrum density of the converter's output signals in a relatively complex manner.

In accordance with a preferred embodiment of the invention, the delta-sigma modulator A/D converter 12 (that is, the combination of the delta-sigma modulator 14 and filter 16) is efficiently tested by the system 10 of FIG. 1, which serves to advantageously compute the S/N ratio of the device in the time domain. As shown in FIG. 1, the system 10 comprises a first Sample and Hold (S/H) device 24 of a well-known design for sampling a periodic input test signal at a first rate in excess of the Nyquist rate (i.e., twice the frequency of the signal) typically a preselected multiple of the Nyquist rate. Although not required, the input test signal is chosen to be sinusoidal. The sample of the input signal taken by the S/H device 24 is supplied to the input of the delta-sigma modulator 14 (i.e., the non-invert (+) input of the differential amplifier 18) each time the delta-sigma modulator is clocked. For each sample input to the delta-sigma modulator 14 in this fashion, the modulator generates an output signal, which is filtered by the filter 16. The output signal of the filter (y'(k)) is indicative of the analog voltage of the sample of the signal input to the modulator.

A second S/H device 26 is also supplied with the input signal and serves samples the signal at a second rate, typically the Nyquist rate. Thus, the S/H device 26 samples at a rate below the first sampling rate. The samples obtained by the S/H device 26, designated y(k), are input to a processor 28, such as a microprocessor or the like, which also receives the samples y'(k) output by the filter 16 of the delta-sigma modulator A/D converter 12. It is not necessary to obtain the samples y(k) at the same time the samples y'(k) are established by the delta-sigma modulator A/D converter 12. Rather, the samples y(k) could be obtained prior to obtaining the samples y'(k) and stored for later use.

In accordance with the invention, the processor 28 serves to calculate the actual S/N ratio of the delta-sigma modulator A/D converter 12 by first computing a noise factor (intermediate error signal) $e^2$ in accordance with the formula:

$$e^2 = \frac{1}{N} \sum_{k=1}^{n} (y'(k) - y(k))^2 \quad (1)$$

From the noise factor $e^2$, the S/N ratio can be computed from the relationship $$S/N = 10 \log_{10}\left(\frac{b^2}{e^2}\right) \quad (2)$$

where b is the magnitude of the output signal of the comparator 22 (typically unity). By comparing the S/N ratio computed from eq.(2) to the lowest allowable S/N value for the delta-sigma modulator A/D converter 12, any faults in the converter will manifest themselves.

As may be appreciated, the instant testing technique will reveal if the delta-sigma modulator A/D converter 12 is operating properly. Correct operation of the delta-sigma modulator A/D converter 12 depends on proper operation of the delta-sigma modulator 14. Thus, the present technique test the delta-sigma modulator 14.

The advantage to testing the delta-sigma modulator converter 12 and, hence, the delta-sigma modulator 14 in the manner described above is that the complexity (i.e., the number of operations needed to obtain the S/N ratio) is on the order of n real multiplications and 2n real additions in comparison to the prior art approach which generally has a complexity of n log (n) +2n complex multiplications and n real additions. Not only is the complexity of testing reduced by the above-described technique, but the time required for testing is reduced since fewer operations need to be performed.

Referring to FIG. 2, there is shown an alternate system 10' for efficiently testing the delta-sigma modulator 14 by itself. The system 10' comprises a processing element 38' which takes the form of an up-down counter clocked by the same clock signal as the delta-sigma modulator 14. Also comprising part of the system 10' is a grounding mechanism, in the form of a switch 40' coupled in series with a resistor 42' between the output of the integrator 20 within the delta-sigma modulator 14 and circuit ground, to reset the voltage at the integrator output to zero. Depending on the design of the delta-sigma modulator 14, the need for the switch 40' and resistor 42' may be obviated if automatic resetting means are provided.

Testing of the delta-sigma modulator 14 by the system 10' is carried out in the following manner. First, the counter 38' is loaded with a predetermined value (e.g., all zeros or all zeros with the exception of the most significant bit.) Next the switch 40' is closed and then opened to reset the output voltage of the integrator 20 to zero. (If automatic resetting of the integrator 20 output voltage is obtainable other than by opening and closing the switch 40' then the switch opening and closing steps would not be necessary).

After the counter 38' has been loaded, and the output voltage of the integrator 20 has been reset, then a dc voltage of predetermined magnitude from a source 43' is applied to the input of the delta-sigma modulator 14. The value of the dc voltage applied to the delta-sigma modulator 14 is selected so that its magnitude is greater or less than the average value of +b and −b (the modulator output signal) which is zero. While the dc input voltage is applied to the delta-sigma modulator 14, the counter 38' is allowed to count for a predetermined number of clock pulses (e.g., 1024 pulses) at which time the contents of the counter are examined.

The contents of the counter 38' at the end of a predetermined number (N) of clock cycles should be substantially proportional to the dc voltage applied to the delta-sigma modulator 14 by a factor of b/N where b is amplitude of the output signal of the modulator (usually unity) and N is the number of clock cycles of the counter 38'. The difference between the count of the counter 38' and the actual value of the dc input voltage applied to the delta-sigma modulator 14 from the source 43' provides an accurate measure of the modulator operation.

It should be noted that although the dc voltage input to the delta-sigma modulator 14 is static, the modulator itself is operating in a dynamic fashion to produce a stream of output bits each time a clock signal is applied thereto. Thus, the dc input signal is effectively sampled at a rate corresponding to the clock frequency. To assure testing of the delta-sigma modulator 14 throughout its dynamic range, the value of the applied dc input voltage should be selected so that the comparator 22 of the modulator is being constantly toggled due to the difference between V and b.

The advantage of testing the delta-sigma modulator 14 with a dc input using the counter 38' in the manner described is that the technique is readily amenable to built-in self-testing (BIST) of the modulator. The counter 38' can be easily incorporated within the delta-sigma modulator 14 during its fabrication without significant difficulties.

The foregoing discloses a technique for verifying the operation of a delta-sigma modulator 14 in accordance with the difference between the modulator output signal when a sample from an input signal is obtained by sampling at a first rate, and a corresponding sample of the signal itself is obtained by sampling the signal at a second rate.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for testing a delta-sigma modulator which serves to convert an analog input signal to a digital output signal, comprising the steps of:
   sampling an input test signal at a first rate and supplying each successive sample to the delta-sigma modulator which, in turn, produces an output signal in accordance with the sample;
   sampling the input test signal at a second rate;
   generating an error signal in accordance with the difference between the value of the output signal generated by the delta-sigma modulator in response to each sample obtained at the first sampling rate, and the value of each sample obtained at the second sampling rate; and
   comparing the error signal to a preselected value, representing the value of the error signal when the delta-sigma modulator is operating properly.

2. The method according to claim 1 further comprising the step of computing the signal-to-noise ratio of the delta-sigma modulator in accordance with the formula:

$$S/N = 10 \log_{10} \left( \frac{b^2}{e^2} \right)$$

S/N is the signal-to-noise ratio, $b^2$ is the square of the magnitude of the delta-sigma modulator output signal; and $e^2$ is an intermediate error signal given by:

$$e^2 = \frac{1}{N} \sum_{k=1}^{n} (y'(k) - y(k))^2$$

y'(k) is the value of the delta-sigma modulator output signal for a successive sample obtained at the first rate, and y(k) is the value of a sample obtained at the second rate.

3. The method according to claim 2 wherein:
   (a) the input signal has a preselected frequency;
   (b) the second sampling rate is chosen to be the Nyquist rate for the input signal; and
   (c) the first sampling rate is chosen to be a preselected multiple of the Nyquist rate.

4. A method for testing a delta-sigma modulator, which serves to convert an analog input signal to a digital output, comprising the steps of:
   applying a dc input signal to a delta-sigma modulator for a prescribed interval; and
   at the completion of said interval, determining whether the modulator output signal is a predetermined multiple of the magnitude of the modulator dc input signal.

5. Apparatus for testing a delta-sigma modulator comprising:
   first means for sampling an input test signal at a first rate and for supplying the samples to the delta-sigma modulator;
   second means for sampling the input signal at a second rate; and
   processor means coupled to the second sampling means and the delta-sigma modulator for generating an error signal in accordance with the difference between the value of the delta-sigma modulator output signal for each sample, and the value of a sample of the signal itself obtained from the second sampling means, and for establishing that the delta-sigma modulator is operating properly in accordance with the difference between the error signal and a prescribed value therefor.

6. The apparatus according to claim 5 wherein the first sampling means is a sample and hold device which samples the input signal at a rate greater than the Nyquist rate for the input signal.

7. The apparatus according to claim 5 wherein the second sampling means is a sample and hold device which samples the input signal at the Nyquist rate for the input signal.

8. Apparatus for testing a delta-sigma modulator which serves to generate a digital signal in response to an analog input signal applied to its input, comprising:
   means for supplying a dc signal, of a magnitude greater than the average amplitude of the delta-sigma modulator output signal, to the input of the delta-sigma modulator; and
   means for summing the output signals output by the delta-sigma modulator over a prescribed interval to determine the dc value of the modulator output signal so as to facilitate comparison with the value of the dc input signal in order to establish the proper operation of the delta-sigma modulator.

9. The apparatus according to claim 8 wherein the summing means comprises an up/down counter.

* * * * *